(12) United States Patent
Prasad

(10) Patent No.: US 6,553,517 B1
(45) Date of Patent: Apr. 22, 2003

(54) INTERLEAVERS AND DE-INTERLEAVERS

(75) Inventor: Mohit K. Prasad, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/545,077

(22) Filed: Apr. 7, 2000

Related U.S. Application Data

(60) Provisional application No. 60/128,467, filed on Apr. 9, 1999.

(51) Int. Cl.[7] .......................... G11C 29/00; G06F 12/16; H04L 23/02; H04J 3/24
(52) U.S. Cl. .................... 714/702; 711/157; 375/265; 370/474
(58) Field of Search ................ 714/779, 776, 714/702; 711/217–220, 5, 157; 370/469–475; 375/265

(56) References Cited

U.S. PATENT DOCUMENTS

| | | | |
|---|---|---|---|
| 4,763,123 A | 8/1988 | Yasuda | 340/825.65 |
| 5,042,033 A | 8/1991 | Costa | 371/2.1 |
| 5,241,563 A | 8/1993 | Paik et al. | 375/1 |
| 5,499,246 A * | 3/1996 | Cooper | 370/345 |
| 5,537,420 A | 7/1996 | Huang | 371/2.1 |
| 5,572,532 A | 11/1996 | Fimoff et al. | 37/22 |
| 5,602,685 A * | 2/1997 | Lee | 360/32 |
| 5,636,224 A | 6/1997 | Voith et al. | 371/2.1 |
| 5,659,580 A | 8/1997 | Partyka | 375/295 |
| 5,682,457 A | 10/1997 | Woo et al. | 386/95 |
| 5,737,252 A | 4/1998 | Hollmann et al. | 364/717.05 |
| 5,737,337 A | 4/1998 | Voith et al. | 371/2.2 |
| 5,764,649 A | 6/1998 | Tong | 371/2.1 |
| 5,799,033 A | 8/1998 | Baggen | 375/200 |
| 6,151,690 A | 11/2000 | Peeters | 714/701 |

* cited by examiner

Primary Examiner—Albert Decady
Assistant Examiner—C H Britt
(74) Attorney, Agent, or Firm—Mayer Fortkort & Williams, PC; Karin L. Williams, Esq.

(57) ABSTRACT

A method and apparatus is provided for interleaving and de-interleaving frame symbols using a single memory buffer. Input frame symbols are read out in an interleaved sequence (or de-interleaved sequence) on a symbol by symbol basis. Frame symbols following the input frame symbols are written into memory locations from where the input frame symbols were read.

22 Claims, 6 Drawing Sheets

INTERLEAVERS AND DE-INTERLEAVERS

CROSS REFERENCE TO RELATED APPLICATIONS

Provisional patent application, serial No. 60/128,467, titled "IN-PLACE INTERLEAVING" filed Apr. 9, 1999 is incorporated herein by reference in its entirety.

FIELD OF THE INVENTION

The present invention relates to digital communication systems. More particularly, it relates to implementation of Interleavers and De-interleavers.

BACKGROUND OF THE INVENTION

Conventional digital systems improve communication performance and reduce the probability of bit error (Pb) by using channel encoding which enables transmitted signals to withstand the effects of various channel impairments, such as noise, fading and jamming. When a channel has memory it exhibits mutually dependent signal transmission impairments. As a result time-correlated impairments occur in bursts instead of as isolated events, and hence cause degradation in error performance.

A conventional technique to improve error performance is by interleaving coded messages before transmission and de-interleaving after reception. Hence bursts of channel errors are spread out in time and a decoder handles errors as if they were random errors instead of burst errors.

Interleavers and de-interleavers are usually implemented by double buffering frame symbols so that interleaved output symbols of one frame are read from one buffer while symbols of the next frame are written to another buffer.

FIG. 1A is a block diagram of a conventional block interleaving system 100. A frame with a specific symbol count is received from an encoder of a digital communication system (not shown) and written into first memory buffer 101. Thereafter, symbols of the first frame are read from the first buffer in an interleaved sequence and symbols of a second frame are written into a second buffer 102. Every successive pair of frames is alternated in the foregoing manner. Hence, double memory buffers are currently used in block interleaving.

FIG. 1B shows a block diagram for a de-interleaver 107 that performs operations to de-interleave a frame. Interleaved symbols of a first frame from de-modulator 104 are written into memory buffer 105 via a de-multiplexer 104A. Thereafter, first frame symbols are read from memory buffer 105 and second frame interleaved symbols are written into memory buffer 106. Every pair of successive frame is alternated in this manner. Hence, conventional digital systems use double buffering for block interleaving and de-interleaving.

For high speed data streams, such as those used in third generation wireless systems, the cost of double buffering is high. For example, 3G3X systems operating at 1036.0 kbps require at least 9.2 KB of RAM for buffering two frames of one bit symbols for interleaving and de-interleaving. In general memory cost for digital communication systems is high and double buffering increases the memory cost for interleaving and de-interleaving.

Therefore, what is desired is an interleaving and de-interleaving system in a digital communication system that reduces memory requirements while maintaining burst error protection.

SUMMARY OF THE INVENTION

The present invention solves the foregoing drawbacks by providing an interleaving and de-interleaving system that reduces memory buffer requirements. According to one aspect of the present invention, the process receives a plurality of symbols for a first frame in a memory buffer, and generates interleave addresses for the first frame symbols Thereafter, the process reads a symbol from among the first frame symbols in an interleave sequence. The process writes a symbol from among the symbols of a second frame at the memory address from where the first symbol was read. The process alternates the read/write sequence until all the symbols have been read out in an interleaved sequence. The foregoing process is performed on a symbol by symbol basis, i.e., an address for a symbol is generated, the symbol is read out and another symbol is written at the address from where the symbol was read out.

In yet another aspect, the process receives a plurality of symbols for a first frame in a memory buffer in an interleaved sequence. Thereafter, the process reads a symbol from among the first frame symbols in a de-interleaved sequence. The process writes a frame symbol from among the symbols of a second frame at the memory address from where the first symbol was read. The process alternates the read/write sequence until all the symbols have been read out in a de-interleaved sequence.

In yet another aspect, the invention provides an address generator for interleaving in a digital communication system. The system includes a symbol counter for counting a plurality of frame symbols and a frame counter for counting a modulus of the plurality of frames ($f_c$) The system also includes the means for performing modulus operation on $f_c$ and Kmax, where Kmax is a predetermined value that determines when a frame is written into memory linearly and read out linearly in an interleaved sequence. The system includes means for computing the interleave address for the plurality of frame symbols based upon the modulus operation.

In yet another aspect, the present invention provides an address generator for de-interleaving frames in a digital communication system. The system includes a symbol counter for counting a plurality of symbols and a frame counter for counting modulus of plurality of frames ($f_c$) The system further includes means for performing modulus operation on $f_c$ and Kmax, where Kmax is a predetermined value that determines when a frame is written into memory linearly and read out linearly, in a de-interleaved sequence. The system also includes the means for computing de-interleaved addresses for the plurality of frame symbols based upon the modulus operation.

The foregoing aspects of the present invention reduce memory buffer requirements because frame symbols are read and written in alternate sequences. Hence when a symbol is read out, another symbol is written at the same address from which the symbol was read.

This brief summary has been provided so that the nature of the invention may be understood quickly. A more complete understanding of the invention can be obtained by reference to the following detailed description of the preferred embodiments thereof in connection with the attached drawings.

DESCRIPTION OF THE DRAWINGS

The use of similar reference numerals in different figures indicates similar or identical items.

DESCRIPTION OF THE INVENTION

The present invention eliminates the need for a second buffer in block interleaving and de-interleaving processes by alternating read and write operations on the same memory location.

Definitions

Figure 3:
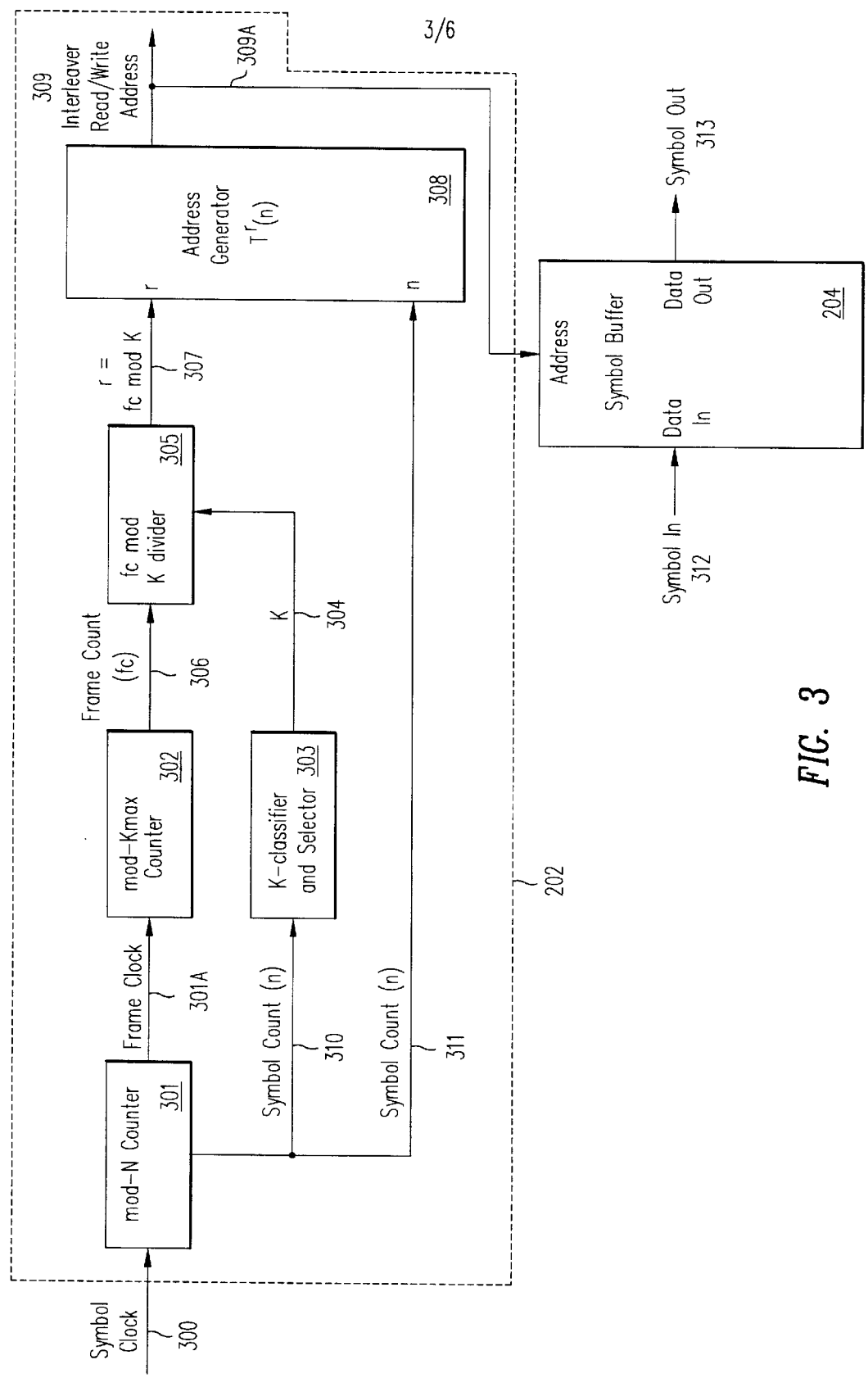
FIG. 3 shows a block diagram of an address generator, according to the present invention.

The following definitions and symbols are used for illustrating various aspects of the present invention:

(a) n: Symbol count (b) $f_c$: Frame count signal (c) K: A variable that depends on the value of n as output by a K-classifier and selector 303 as described below (FIG. 3).

(d) r: Integer remainder value determined by $f_c//K$.

(e) Kmax: Least common multiple of all values returned by K-classifier and selector 303 for any symbol count.

(f) N: Frame size i.e. the number of symbols in a frame (g) T(n)=Transform performed to map the written address of a symbol to a read address either as an interleaved sequence or a de-interleaved sequence.

(h) $T^r(n)$=Transform T(n) repeated r times, with $T^0(n)=n$.

(i) Mod=Modulo in Figures and Equations

Figure 1A:
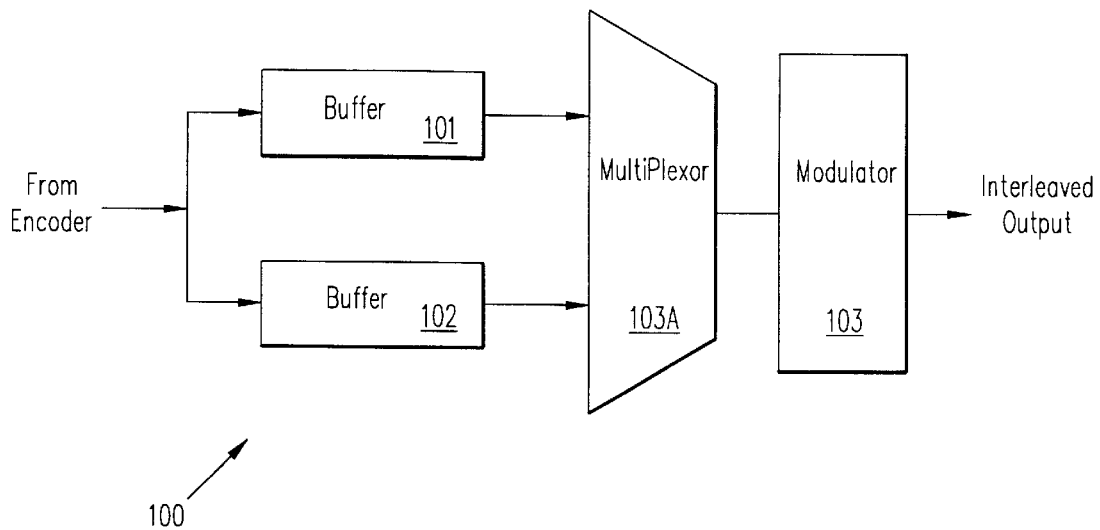
FIG. 1A shows a prior art block diagram of an interleaving system.
Figure 1B:
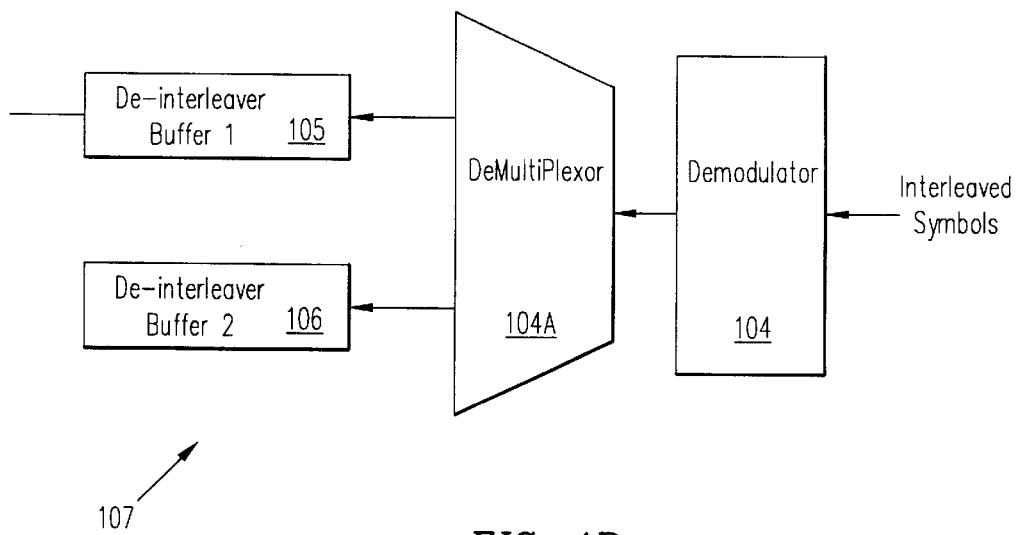
FIG. 1B shows a prior art block diagram of a de-interleaving system.
Figure 2A:
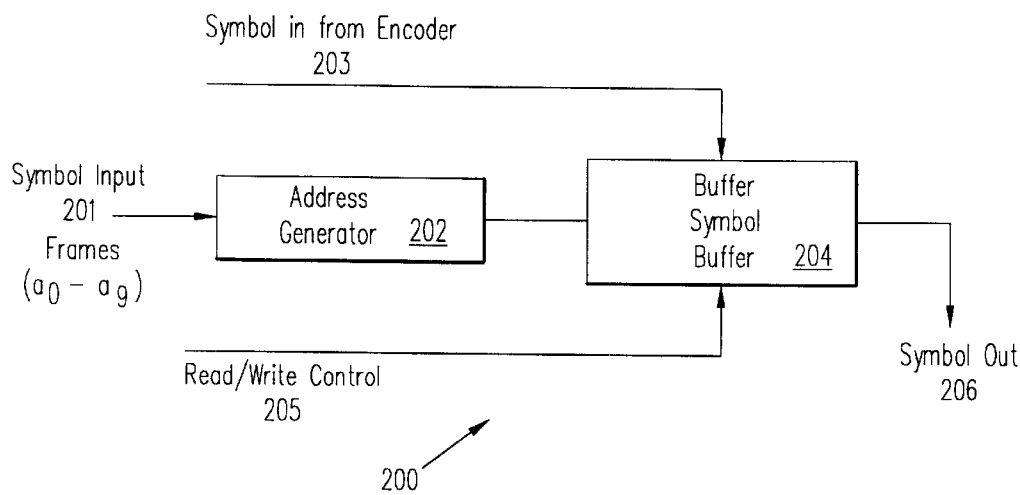
FIG. 2A is a block diagram of an interleaving system, according to the present invention.

FIG. 2A shows a block diagram of an interleaver 200 according to one aspect of the present invention. Incoming symbols 201 are sent to an address generator 202 and symbol addresses from address generator 202 are sent to a memory buffer 204. Memory buffer 204 also receives symbols 203 from an encoder (not shown). A Read/write control system (not shown) provides read and write commands over line 205. The commands provided over line 205 alternate read and write sequences for the same memory location, and hence a single memory is utilized for interleaving as discussed below.

Figure 2B:
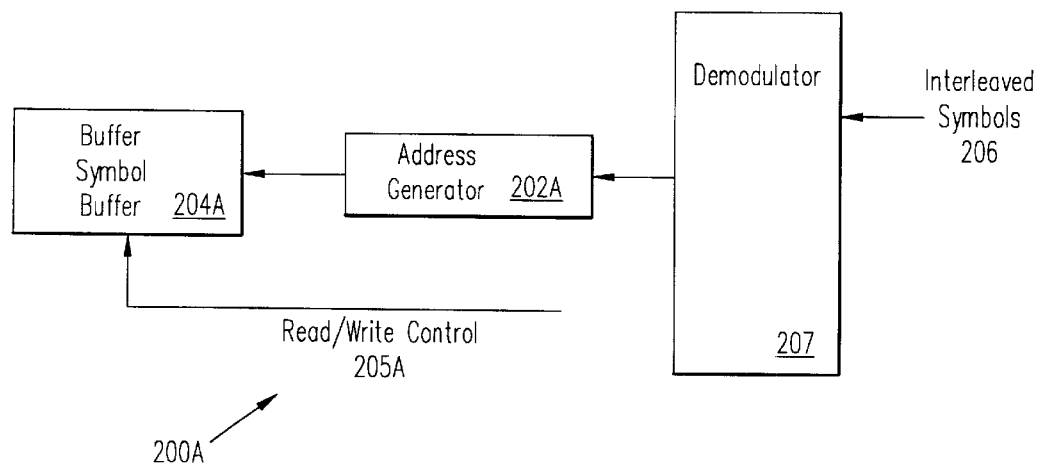
FIG. 2B is a block diagram of a de-interleaving system, according to the present invention.

FIG. 2B shows a block diagram of a de-interleaver 200A, according to yet another aspect of the present invention. FIG. 2B block components have similar functionality compared to FIG. 2A block components except that in FIG. 2B symbols are de-interleaved instead of being interleaved. Interleaved symbols 206 are received by a demodulator 207 and then sent to an address generator 202A that provides addresses to a memory buffer 204A. A Read/write control system (not shown) provides read and write commands over line 205A. The commands provided over line 205A alternate read and write sequences for the same memory location, and hence a single memory is utilized for de-interleaving.

FIG. 3 shows a block diagram of address generator 202 according to another aspect of the present invention. An output from a Symbol counter (not shown) referred to as Symbol Clock is sent to a Modulo-N counter 301 over line 300. Modulo-N counter 301 cycles through the number of symbols in a frame and generates a frame clock signal that is sent to a Modulo-Kmax counter 302 via line 301A. Modulo-N counter 301 also generates symbol count (n) that is sent to a K-classifier and Selector 303 and to an Address Transformation Module 308, via lines 310 and 311 respectively.

Modulo-Kmax counter 302 provides an output $f_c$, the modulus of frame counts. The frame count signal ($f_c$) is sent via line 306 to $f_c$ mod K divider 305 that divides $f_c/K$ and generates an integer remainder r, where r=$f_c$ mod K. Remainder r is sent to address transformation module 308 via line 307. The value of r determines the number of transforms that may be required before an interleaved (or de-interleaved) sequence may be read out. The value of r is used by address transformation module 308 that performs the transforms for generating symbol addresses.

K-classifier and selector 303 determine the values of variable K, as described below. The value of K is sent to fc mod K divider 305 via line 304. Interleaved Read/Write address 309 is read out via line 309A and sent to symbol buffer 204 where symbols are read and written in an alternate sequence, as described below. FIG. 3 also shows input symbols 312 being written into symbol buffer 204 and read out as output symbol 313.

The functionality of K, r and $f_c$ is described below. It is noteworthy that the values of N and Kmax are predetermined.

Figure 4:
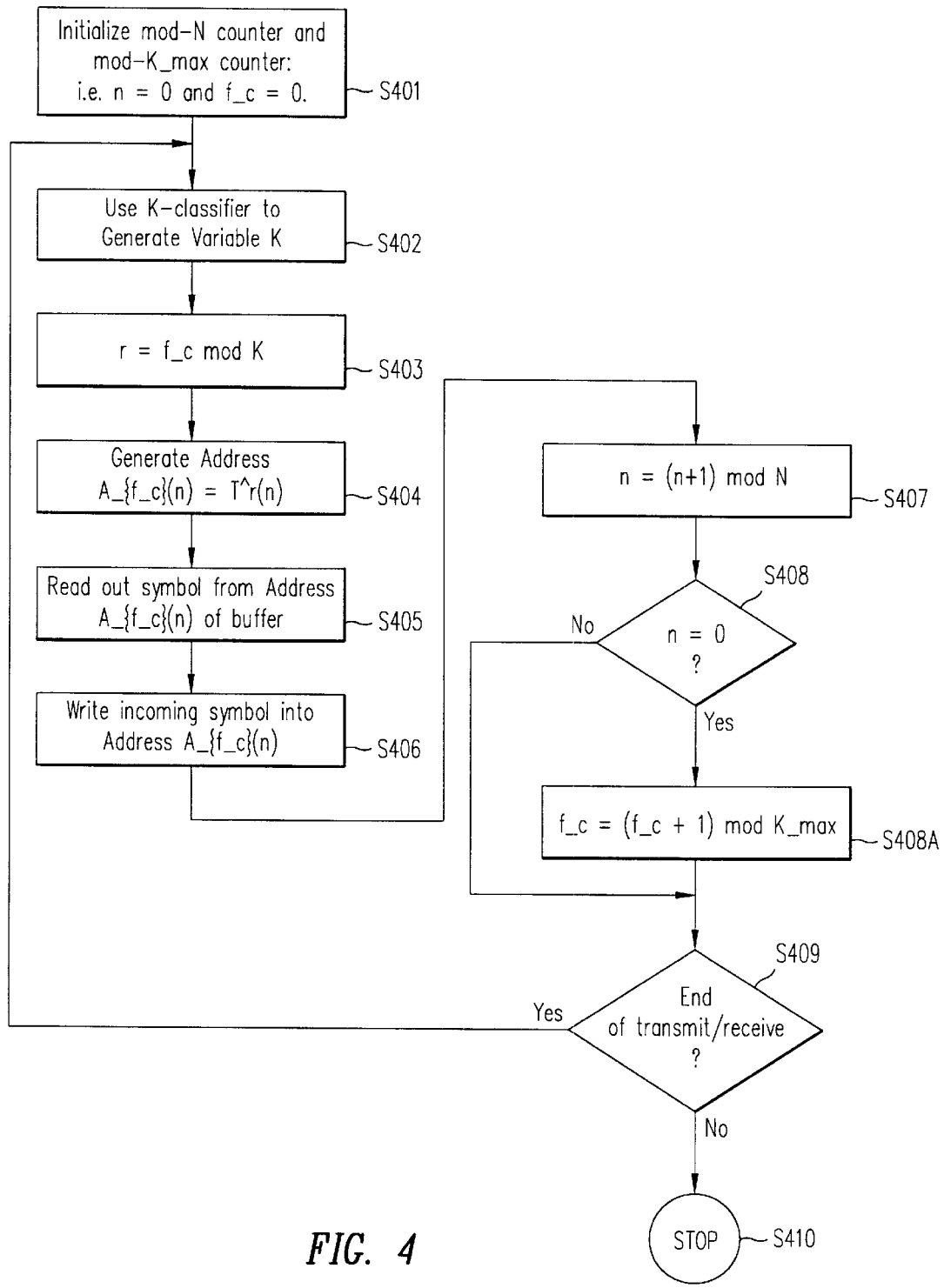
FIG. 4 is a flow diagram showing process steps according to the present invention.

FIG. 4 is a flow diagram showing process steps according to another aspect of the present invention.

In step S401, initialize Modulo-N counter 301 and Modulo-Kmax counter 302 such that n=0, where n is the symbol count, and $f_c$=0. Modulo-N counter 301 also receives a symbol clock signal from an encoder (not shown) via line 300 and generates symbol count n. Symbol count n is sent to K-classifier and selector 303 and to address transformation module 308, via lines 310 and 311 respectively. Modulo-N counter 301 also generates a frame clock signal and sends the frame clock signal to Modulo-Kmax counter 302 via line 301A.

In step S402, K-classifier and selector 303 generates variable K values and sends variable K values over line 304 to $f_c$ mod K divider 305.

In step S403, $f_c$ mod K divider 305 generates an integer remainder of the division of $f_c/K$ which is the value of r.

In step S404, address transformation module 308 generates addresses for a particular symbol, designated for illustration purposes as $A_{fc}(n)$. As described below, address transformation module 308 performs plural transforms to generate the address, where the number of transforms are based upon the value of r.

In step S405, the symbol with address $A_{fc}(n)$ is read out from symbol buffer 204.

In step S406, the process writes another symbol at the address $A_{fc}(n)$.

In step S407, the process updates the value of n using n=(n+1)Mod N. It is noteworthy that the value of n varies cyclically.

In step S408, the process determines if n=0. If n=0, then the process proceeds to step S408A. If n≠0, the process moves to step S409, to determine if there are any new symbols. If all symbols have been processed, then the process moves to step S410. If all the symbols have not been processed, then the process moves to S404.

In step S408A, the process moves to the next frame count and thereafter the process moves to step S409 to determine if there are any new symbols. If there are new symbols, the process moves to step S404 and steps S404–S407 are repeated. If there are no new symbols the process stops at step S410.

The following provides a description of the alternate read and write steps performed in steps S404 to S406.

Simple Case Study of alternating read/write operations:

Assume that a first frame is received in symbol buffer 204 (FIG. 3, Symbol 312). For illustration purposes assume that the first frame has 9 symbols and is received in a predetermined sequence:

a0 a1 a2 a3 a4 a5 a6 a7 and a8

The first input sequence is written as a block arrangement in rows. Table 1 shows the first input sequence of a0 to a8 stored linearly as rows.

As shown above in step S405, read out the first symbol of the first frame in an interleaved sequence based upon the address generated by address transformation module 308. As shown in the bottom row of Table 1, the predetermined interleaved sequence is given by:

a0 a3 a6 a1 a4 a7 a2 a5 a8 and is read out from symbol buffer 204.

The first symbol is read out from symbol buffer 204. Table 1, column 2 shows a0 read out in the output interleaved sequence.

According to step S406, a first symbol of a second frame is written to the memory address from where the first symbol of the first frame was read. For illustration purposes, a second frame with 9 symbols is shown in the top row of Table 1 as: b0 b1 b2 b3 b4 b5 b6 b7 b8. The second input sequence is also written as a block arrangement in rows. Table 1 shows symbol b0 of the second frame written to the memory address from where a0 was read.

The alternate read/write scheme operates until all the symbols of a frame have been read. For example a3 is read out and b1 is written at the memory address from where a3 was read. Similarly a6, a1, a4, a7, a2, a5 and a8 are read as per the foregoing output sequence and symbols b2, b3, b4, b5, b6, b7 and b8 are written at addresses corresponding to a6, a1, a4, a7, a2 and a5.

The process continues with the next frame count in step S408A. For example, the first symbol of the second output sequence i.e. b0 is read out and the first symbol of a third input sequence (not shown) is written at the address from where b0 is read out. The second interleaved sequence is shown in the right most column of Table 1 as:

b0 b3 b6 b1 b4 b7 b2 b5 b8

The alternate read/write steps are stopped after it is determined in step S409 that there are no new symbols.

The foregoing process steps illustrate that only a single memory buffer is used for interleaving by alternating read and write operations, and storing symbols at memory locations from where symbols have been read.

Process steps S401 to S410 are also used to de-interleave symbols, the only difference is that input symbols are read out in a de-interleaved sequence instead of being read out in an interleaved sequence.

TABLE 1

| Second Frame: | | b0 | b1 | b2 | b3 | b4 | b5 | b6 | b7 | b8 | |
|---|---|---|---|---|---|---|---|---|---|---|---|
| M | a0 | b0 | b0 | b0 | b0 | b0 | b0 | b0 | b0 | b0 | |
| E | a1 | a1 | a1 | a1 | b3 | b3 | b3 | b3 | b3 | b3 | |
| M | a2 | a2 | a2 | a2 | a2 | a2 | b6 | b6 | b6 | b6 | Interleaved |
| O | a3 | a3 | b1 | b1 | b1 | b1 | b1 | b1 | b1 | b1 | Addressing |
| R | a4 | a4 | a4 | a4 | a4 | b4 | b4 | b4 | b4 | b4 | |
| Y | a5 | a5 | a5 | a5 | a5 | a5 | a5 | a5 | b7 | b7 | |
| B | a6 | a6 | a6 | b2 | b2 | b2 | b2 | b2 | b2 | b2 | |
| U | a7 | a7 | a7 | a7 | a7 | a7 | a7 | b5 | b5 | b5 | |

TABLE 1-continued

| Second Frame: | | b0 | b1 | b2 | b3 | b4 | b5 | b6 | b7 | b8 |
|---|---|---|---|---|---|---|---|---|---|---|
| F | a8 | a8 | a8 | a8 | a8 | a8 | a8 | a8 | a8 | b8 |
| Output: | a0 | a3 | a6 | a1 | a4 | a7 | a2 | a5 | a8 | |

The foregoing example shows a simple addressing scheme where a frame only has 9 symbols. The value of K are 1 and 2, such that Kmax=2 and r=0 or 1. Hence $T^0(n)$ is an identity transform that illustrates a linear relationship between the address from where a plurality of symbols are read out and the address to which a plurality of symbols are written into. In cases where the transform T(n) is more complicated (usually when the number of symbols per frame are large) a more elaborate addressing scheme may be required, as described below.

Complex Case Study of alternating read/write operations:

Assume that the frame size of input frames is 24 symbols and the first frame has symbols a0 to a23. Then input symbol count n is given by $0 \leq n \leq 23$ and an output sequence T(n) is given by:

$$T(n)=6*(n\%4)+\text{Bit\_rev}_3(\lfloor n/4 \rfloor) \tag{1}$$

where n%4 is the remainder after n is divided by 4, $\lfloor n/4 \rfloor$ is the integer quotient when n is divided by 4; $\text{Bit\_rev}_3$ is a function representing the bit reversal value of a 3 bit argument.

Table 2 shows the relationship between linear input address and interleaved output address for the first frame with 24 symbols. This is also the output transform for $0 \leq n \leq 23$.

TABLE 2

| Linear Input Address n | Interleaved Output Address T(n) | Linear Input Address n | Interleaved Output Address T(n) |
|---|---|---|---|
| 0 | 0 | 12 | 3 |
| 1 | 12 | 13 | 15 |
| 2 | 6 | 14 | 9 |
| 3 | 18 | 15 | 21 |
| 4 | 1 | 16 | 4 |
| 5 | 13 | 17 | 16 |
| 6 | 7 | 18 | 10 |
| 7 | 19 | 19 | 22 |
| 8 | 2 | 20 | 5 |
| 9 | 14 | 21 | 17 |
| 10 | 8 | 22 | 11 |
| 11 | 20 | 23 | 23 |

Table 3 below shows input symbols a0 to a23 stored as rows, with an interleave sequence for the first frame as a0 a12 a6 a18 a1 a13 a7 a19 a2 a14 a8 a20 a3 a15 a9 a21 a4 a16 a10 a22 a5 a17 a11 and a23. Table 3, Column 24 shows symbols from the second frame stored as rows: b0, b4 b8, b12, b16, b20, b2, b6, b10, b14, b18, b22, b1, b5, b9, b13, b17, b21, b3, b7, b11, b15, b19 and b23. The second frame symbols are not written linearly into the frame buffer and hence cannot be read directly as an interleaved sequence. Hence a mapping transformation, as described below is used to map the stored second frame symbols to an interleaved sequence, where the address for the second and subsequent frames is generated by address transformation module 308.

Mapping transformations are performed until Kmax frames. The succeeding frame (i.e. after Kmax frames) is input linearly and read out directly as an interleaved sequence. The foregoing alternate read and write process is then repeated. The same process is applied for de-interleaving. Table 3 below serves as a partial illustration of a complex case study, and also only one frame has been shown.

$Q_1=\{0\}$
$Q_2=\{1, 12, 3, 18, 10, 8, 2, 6, 7, 19, 22, 11, 20, 5, 13, 15, 21, 17, 16, 4\}$
$Q_3=\{9, 14\}$
$Q_4=\{23\}$

TABLE 3

| | Input: | b0 | b1 | b2 | b3 | b4 | b5 | b6 | b7 | b8 | b9 | b10 | b11 |
|---|---|---|---|---|---|---|---|---|---|---|---|---|---|
| M | a0 | b0 | b0 | b0 | b0 | b0 | b0 | b0 | b0 | b0 | b0 | b0 | b0 |
| E | a1 | a1 | a1 | a1 | a1 | b4 | b4 | b4 | b4 | b4 | b4 | b4 | b4 |
| M | a2 | a2 | a2 | a2 | a2 | a2 | a2 | a2 | a2 | b8 | b8 | b8 | b8 |
| O | a3 | a3 | a3 | a3 | a3 | a3 | a3 | a3 | a3 | a3 | a3 | a3 | a3 |
| R | a4 | a4 | a4 | a4 | a4 | a4 | a4 | a4 | a4 | a4 | a4 | a4 | a4 |
| Y | a5 | a5 | a5 | a5 | a5 | a5 | a5 | a5 | a5 | a5 | a5 | a5 | a5 |
| . | a6 | a6 | a6 | b2 | b2 | b2 | b2 | b2 | b2 | b2 | b2 | b2 | b2 |
| . | a7 | a7 | a7 | a7 | a7 | a7 | a7 | b6 | b6 | b6 | b6 | b6 | b6 |
| . | a8 | a8 | a8 | a8 | a8 | a8 | a8 | a8 | a8 | a8 | a8 | b10 | b10 |
| B | a9 | a9 | a9 | a9 | a9 | a9 | a9 | a9 | a9 | a9 | a9 | a9 | a9 |
| U | a10 | a10 | a10 | a10 | a10 | a10 | a10 | a10 | a10 | a10 | a10 | a10 | a10 |
| F | a11 | a11 | a11 | a11 | a11 | a11 | a11 | a11 | a11 | a11 | a11 | a11 | a11 |
| F | a12 | a12 | b1 | b1 | b1 | b1 | b1 | b1 | b1 | b1 | b1 | b1 | b1 |
| E | a13 | a13 | a13 | a13 | a13 | a13 | b5 | b5 | b5 | b5 | b5 | b5 | b5 |
| R | a14 | a14 | a14 | a14 | a14 | a14 | a14 | a14 | a14 | a14 | b9 | b9 | b9 |
| . | a15 | a15 | a15 | a15 | a15 | a15 | a15 | a15 | a15 | a15 | a15 | a15 | a15 |
| . | a16 | a16 | a16 | a16 | a16 | a16 | a16 | a16 | a16 | a16 | a16 | a16 | a16 |
| . | a17 | a17 | a17 | a17 | a17 | a17 | a17 | a17 | a17 | a17 | a17 | a17 | a17 |
| . | a18 | a18 | a18 | a18 | b3 | b3 | b3 | b3 | b3 | b3 | b3 | b3 | b3 |
| . | a19 | a19 | a19 | a19 | a19 | a19 | a19 | a19 | b7 | b7 | b7 | b7 | b7 |
| . | a20 | a20 | a20 | a20 | a20 | a20 | a20 | a20 | a20 | a20 | a20 | a20 | b11 |
| . | a21 | a21 | a21 | a21 | a21 | a21 | a21 | a21 | a21 | a21 | a21 | a21 | a21 |
| . | a22 | a22 | a22 | a22 | a22 | a22 | a22 | a22 | a22 | a22 | a22 | a22 | a22 |
| . | a23 | a23 | a23 | a23 | a23 | a23 | a23 | a23 | a23 | a23 | a23 | a23 | a23 |
| Output: | | a0 | a12 | a6 | a18 | a1 | a13 | a7 | a19 | a2 | a14 | a8 | a20 |

| | Input: | b12 | b13 | b14 | b15 | b16 | b17 | b18 | b19 | b20 | b21 | b22 | b23 |
|---|---|---|---|---|---|---|---|---|---|---|---|---|---|
| M | | b0 | b0 | b0 | b0 | b0 | b0 | b0 | b0 | b0 | b0 | b0 | b0 |
| E | | b4 | b4 | b4 | b4 | b4 | b4 | b4 | b4 | b4 | b4 | b4 | b4 |
| M | | b8 | b8 | b8 | b8 | b8 | b8 | b8 | b8 | b8 | b8 | b8 | b8 |
| O | | b12 | b12 | b12 | b12 | b12 | b12 | b12 | b12 | b12 | b12 | b12 | b12 |
| R | | a4 | a4 | a4 | a4 | b16 | b16 | b16 | b16 | b16 | b16 | b16 | b16 |
| Y | | a5 | a5 | a5 | a5 | a5 | a5 | a5 | a5 | b20 | b20 | b20 | b20 |
| . | | b2 | b2 | b2 | b2 | b2 | b2 | b2 | b2 | b2 | b2 | b2 | b2 |
| . | | b6 | b6 | b6 | b6 | b6 | b6 | b6 | b6 | b6 | b6 | b6 | b6 |
| . | | b10 | b10 | b10 | b10 | b10 | b10 | b10 | b10 | b10 | b10 | b10 | b10 |
| B | | a9 | a9 | b14 | b14 | b14 | b14 | b14 | b14 | b14 | b14 | b14 | b14 |
| U | | a10 | a10 | a10 | a10 | a10 | a10 | b18 | b18 | b18 | b18 | b18 | b18 |
| F | | a11 | a11 | a11 | a11 | a11 | a11 | a11 | a11 | a11 | a11 | b22 | b22 |
| F | | b1 | b1 | b1 | b1 | b1 | b1 | b1 | b1 | b1 | b1 | b1 | b1 |
| E | | b5 | b5 | b5 | b5 | b5 | b5 | b5 | b5 | b5 | b5 | b5 | b5 |
| R | | b9 | b9 | b9 | b9 | b9 | b9 | b9 | b9 | b9 | b9 | b9 | b9 |
| . | | a15 | b13 | b13 | b13 | b13 | b13 | b13 | b13 | b13 | b13 | b13 | b13 |
| . | | a16 | a16 | a16 | a16 | a16 | b17 | b17 | b17 | b17 | b17 | b17 | b17 |
| . | | a17 | a17 | a17 | a17 | a17 | a17 | a17 | a17 | a17 | b21 | b21 | b21 |
| . | | b3 | b3 | b3 | b3 | b3 | b3 | b3 | b3 | b3 | b3 | b3 | b3 |
| . | | b7 | b7 | b7 | b7 | b7 | b7 | b7 | b7 | b7 | b7 | b7 | b7 |
| . | | b11 | b11 | b11 | b11 | b11 | b11 | b11 | b11 | b11 | b11 | b11 | b11 |
| . | | a21 | a21 | a21 | b15 | b15 | b15 | b15 | b15 | b15 | b15 | b15 | b15 |
| . | | a22 | a22 | a22 | a22 | a22 | a22 | a22 | b19 | b19 | b19 | b19 | b19 |
| . | | a23 | a23 | a23 | a23 | a23 | a23 | a23 | a23 | a23 | a23 | a23 | b23 |
| Output: | a3 | a15 | a9 | a21 | a4 | a16 | a10 | a22 | a5 | a17 | a11 | a23 |

Mapping Transformation Example

Using Table 2, a cyclic sequence of addresses may be provided by successive transformation of addresses. For the above example, there are four sequence S1, S2, S3 and S4 with defined elements, e.g.,

S1=0→0→0→0 . . .

S2=1→12→3→18→10→8→2→6→7→19→22→11→20→5→13→15→21→17→16→4→1→ . . .

S3=9→14→9→ . . .

S4=23→23→ . . .

The set of elements contained in the sequences above may be illustrated as disjoint sets $Q_1$, $Q_2$, $Q_3$ and $Q_4$, where:

The number of elements in disjoint sets $Q_1$, $Q_2$, $Q_3$ are denoted by $K_1$, $K_2$, $K_3$ and $K_4$. Kmax is then defined as the least common multiple (LCM) of $K_1$, $K_2$, $K_3$ and $K_4$. In the foregoing illustration, Kmax may be predetermined by the LCM of 1, 20, 2, 1, i.e., 20.

For any input symbol, K-classifier and selector (303) determines the value of K based upon $K_1$, $K_2$, $K_3$ and $K_4$. For example, if n∈$Q_1$, then K-Classifier 303 returns the value $K_i$, where i=1,2,3,4.

As described above, based upon the value of $f_c$ and K, remainder r is computed by $f_c$ mod K divider 305. Remainder r is then input to address transformation module 308. Address transformation module 308 creates the addresses by T'(n), where T'(n) is recursive transformation for T(n) (see equation 1 above), and applied r times to argument n. Hence, for the foregoing example, $T^1(1)=12$, $T^2(1)=3$, and so forth.

The output 309 from address transformation module 308 is a plurality of memory addresses for symbol buffer 204. Address 309 is used to first read an interleaved symbol 313 and the same address is then used to write a new input symbol 312. The cycle is repeated for every symbol in every frame until transmission of incoming frames is terminated.

Generic application of the foregoing concept(s):

In a generic case, an interleaved sequence for an input linear array is specified by transformation T(n) for $0 \leq n \leq N-1$, for the nth symbol with frame length N. T(n) provides the read address for symbols stored linearly in memory buffer 204.

$T^r(n)$ gives the transformation for the nth symbol at the $f_c^{th}$ frame where $r=(f_c \bmod K_{max}) \bmod K$ as shown in FIG. 3. Mathematically this is equivalent to stating that $r=f_c \bmod K$ but a preferred physical realization is more accurately reflected in the former equation, $r=(f_c \bmod K_{max}) \bmod K$. As discussed above r is sent to address transformation module 308 via line 307. Address transformation module 308 calculates transforms $T^r(n)$ based upon the value of r and symbol count n. The complexity of performing the transforms by address transformation module 308 depends upon the maximum value of the output of K-classifier and selector 303.

K-classifier and selector 303 partitions symbols into disjoint sets based on the position of the symbol (n) within a frame, as illustrated in the foregoing example. The structure of K-classifier and selector 303 depends upon the interleaving scheme (T(n)) and frame size (N), and is predetermined for any given application.

Since the complexity of performing transforms by address transformation module 308 depends upon the maximum value generated by K-classifier and selector 303, the process is simplified if r is represented as a binary number, for example, $r=(r_{m-1}, r_{m-2}, r_{m-3}, \ldots r_0)$. Based upon the binary representation of r, $T^r(n)$ may be decomposed into successive applications of the transform viz. $T^0(n)$, $T^1(n)$, $T^2(n)$, $T^3(n) \ldots T^{m-1}(n)$, where $m=\log_2 \text{Max}(K_1, K_2, K_3, \_)$.

For the foregoing generic case, K-classifier and selector 303 may be built by examining transform T(n) for values of $n=0, 1, 2, \ldots, N-1$. Based upon the foregoing discussion, cyclic sequences $S_1, S_2, \ldots, S_L$ are identified, where L is a positive integer. Sets $Q_1, Q_2, \ldots, Q_L$ corresponding to sequences $S_1, S_2, \ldots, S_L$ are identified prior to building K-classifier and selector 303. Based upon the number of elements in $Q_1, Q_2, \ldots, Q_L$ the size of these sets are determined and denoted as $K_1, K_2, \ldots, K_L$. Since the size of the sets are known, a logic circuit may be constructed such that for any value of symbol count n, the logic circuit determines the sequence $S_1, S_2, \ldots, S_L$ and a set from among $Q_1, Q_2, \ldots, Q_L$ to which symbol count n may belong. Based on this determination the logic circuit outputs the value K that denotes the size of the identified set.

Figure 5A:
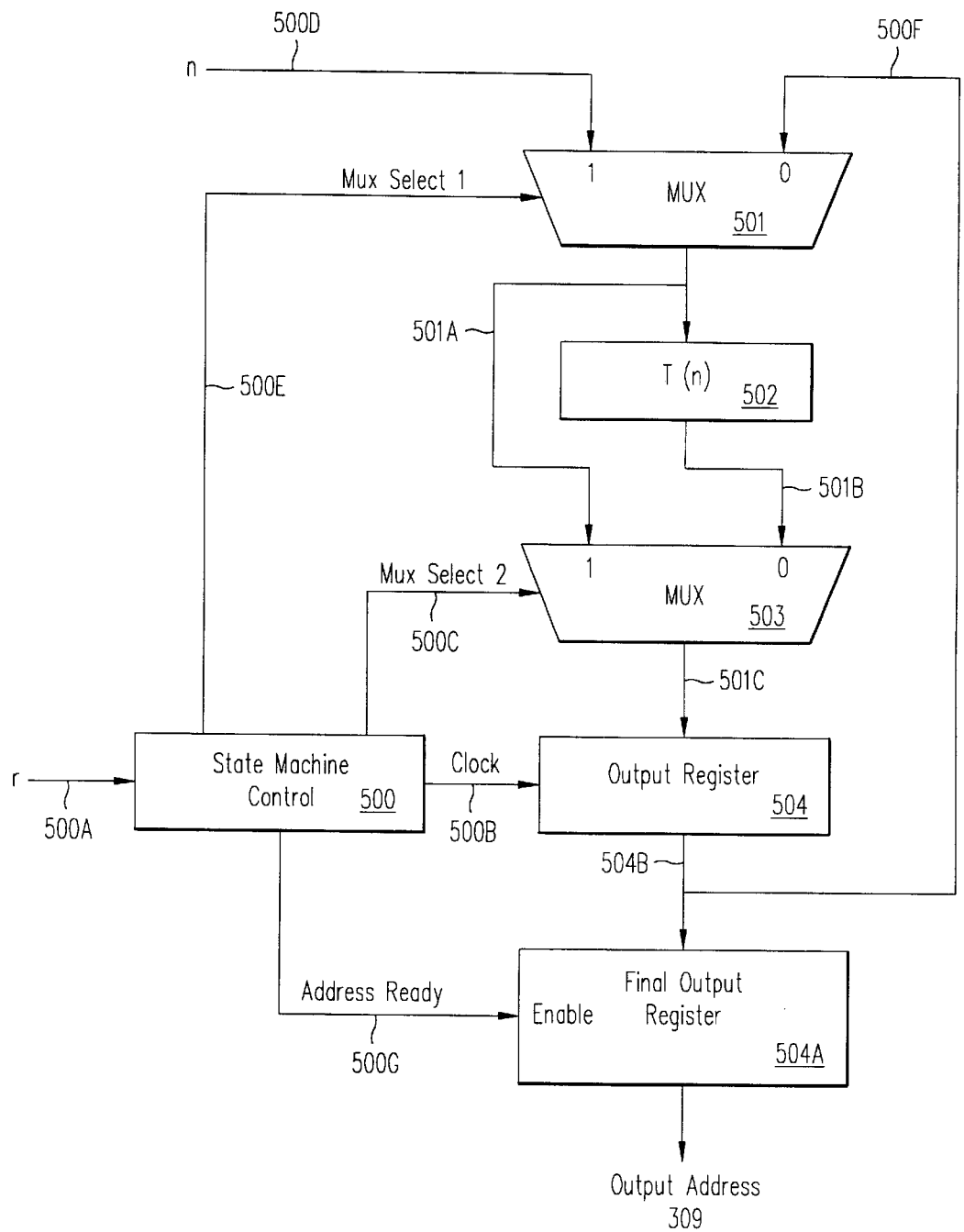
FIG. 5A is a block diagram showing a serial implementation for an address transformation module, according to the present invention.
Figure 5B:
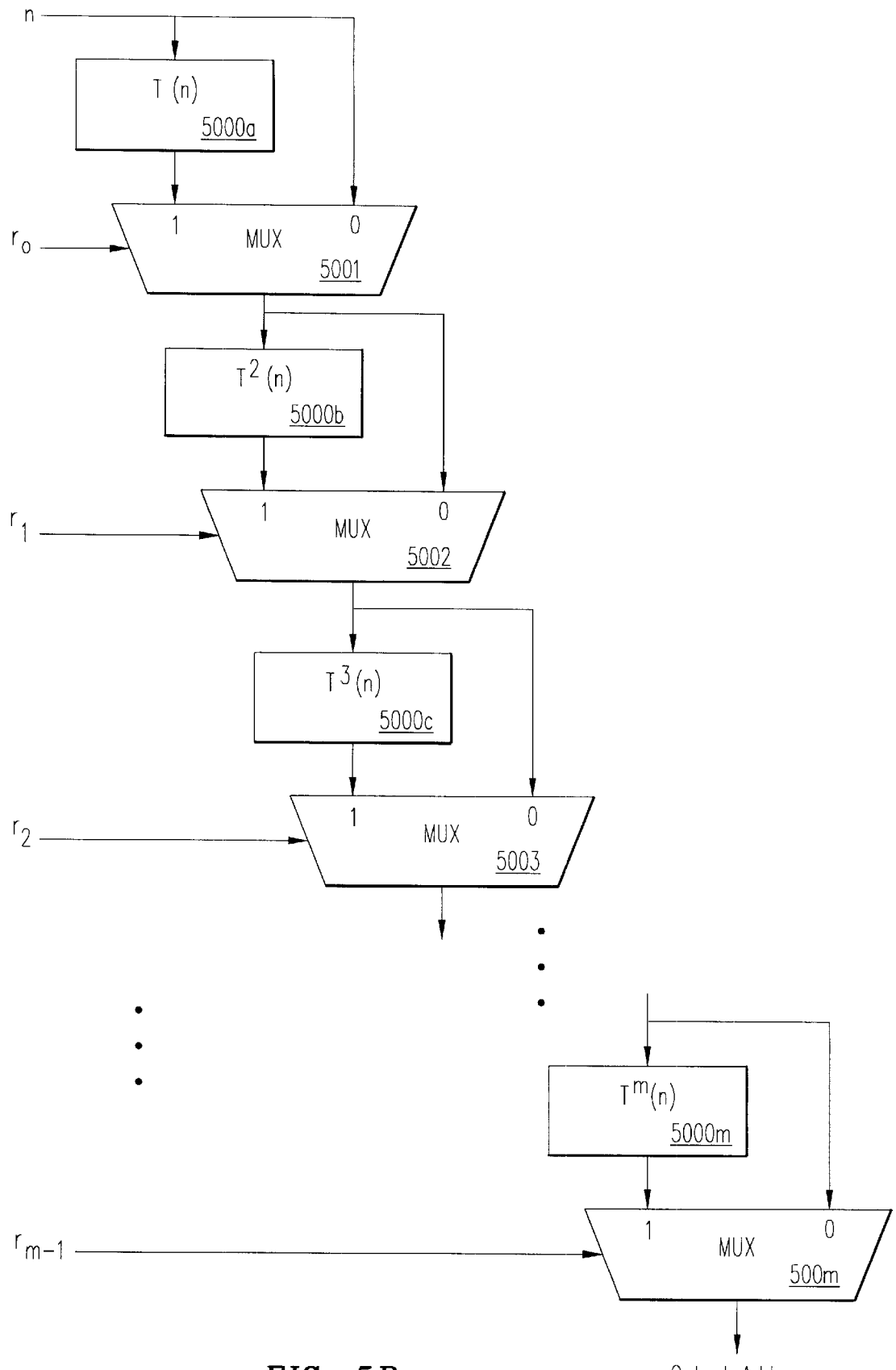
FIG. 5B is a block diagram showing a parallel implementation for the address transformation module, according to the present invention.

FIGS. 5A and 5B provide two ways of performing the foregoing recursive transforms.

FIG. 5A is a block diagram showing a serial implementation for address transformation module 308 to perform transforms for generating interleaved addresses. The following process steps illustrate the serial implementation for FIG. 5A:

(a) The value of r is sent to a state machine control system 500 via line 500A, and the value of n is sent to a multiplexer ("Mux") 501 via line 500D.

(b) Transform $T^r(n)$ is computed in r iterations. For the first iteration, Mux 501 selects input n via line 500D and state machine control system 500 checks if r=0.

(c) If r=0, then Mux 503 is set to 1 via line 500C, and the output of Mux 503 is the same as the output of Mux 501. In this case Mux 503 receives the output of Mux 501 via line 501A. Mux 503 transfers Mux 501 output to an output register 504. State machine control system 500 decrements the value of r by 1 and stores the reduced value of r as a new value. State machine control system 500 compares the new value of r with 0. If the new value is less than 0 the process stops the iteration. State machine control 500 indicates the end of the iteration process by an "address ready" signal to a final output register 504A via line 500G. Output register 504 sends an output address (output from Mux 501) via line 504B to final output register 504A. Final output register 504A transfers output address 309 to symbol buffer 204 via line 309A (FIG. 3).

(d) If r is not equal to 0 then Mux 503 is set to zero via line 500C. Transform block 502 performs a transform and that transform is sent to Mux 503 via line 501B. Also in this case the output of Mux 503 is the same as the output from transform block 502. Mux 503 sends the output from transform block 502 to output register 504. Thereafter, output register 504 transfers transform block 502 output to Mux 501, via line 500F. State machine control system 500 decrements the value of r by 1 and stores the reduced value of r as a new value. State machine control system 500 compares the new value of r with 0. If the new value is less than 0 the process stops the iteration and as in step (c), the output address 309 is sent to symbol buffer 204.

(e) If the new value of R is greater than or equal to zero, then the process steps (c) and (d) are repeated.

It is noteworthy that the input to transform block 502 is the output of Mux 501. For the first iteration (step (a)) the output of transform block is T(n). Subsequently the successive iterations output $T^2(n)$, $T^3(n)$, $T^4(n)$, and so on respectively.

FIG. 5B shows a parallel implementation for address transformation module 308. A plurality of multiplexors (Mux 5001, Mux 5002, - - - Mux 500m) are used. A particular Mux is chosen by using binary lines $(r_{m-1}, r_{m-2}, \ldots, r_1, r_0)$ which represent the input value of r to a plurality of transformation blocks illustrated as 5000A, 5000B - - - 5000m. The input value of r is a m-bit binary number denoted as $r_{m-1}, r_{m-2}, \ldots, r_1, r_0 \ldots$, where $r_{m-1}$ is the most significant bit ("MSB") and $r_0$ is the least significant bit ("LSB").

Mux 5001, may have two inputs i.e. the value of n and/or the output of transform block 5000. The input to other multiplexors, e.g., Mux 5001, Mux 5002 etc., is either the output of a preceding transformation block or the output of a preceding Mux. For example, Mux 5002 may have inputs (a) an output from Mux 5001 or (b) an output from transform block 5000a.

By the arrangement of FIG. 5B, a transform $T^i(n)$ in Mux i is either performed or bypassed. The value of a binary line controls the selection of an input to be output by the corresponding Mux. For example, a value of 1 selects the input corresponding to the output of a preceding transform block and a value of 0 selects the input corresponding to the output of a preceding Mux (or n in the initial case). So, if $r_0=0$, Mux 5001 selects the input for n. If $r_0=1$, Mux 5001 selects the input for the output of transform block 5000a. For Mux 5002 if $r_1=0$, Mux 5002 selects the input for the output of Mux 5001. If $r_1=1$, Mux 5002 selects the input for the output of transform block 5000b. Hence in this manner the process performs m steps to transform n to $T^r(n)$ for determining output addresses 309.

The foregoing system and methodology is also used for de-interleaving frame symbols received from de-modulator 207, where interleaved symbols are written into memory and then read in a de-interleaved sequence. De-interleaving is the reverse of interleaving i.e. symbols in interleaved sequences are received and then read out in a de-interleaved sequence is read from symbol buffer. The transform used for alternating read and write operations during de-interleaving is the inverse of transform T(n).

The foregoing aspects of the present invention reduce memory buffer requirements because frame symbols are read and written in alternate sequences. Hence when a symbol is read out, another symbol is written at the same address from which the symbol was read.

Although the present invention has been described with reference to specific embodiments, these embodiments are illustrative only and not limiting. Many other applications and embodiments of the present invention will be apparent in light of this disclosure and the following claims.

What is claimed is:

1. A method for interleaving a plurality of frame symbols and generating addresses for the plurality of interleaved frame symbols in a digital communication system, comprising:

generating a frame count ($f_c$) for a plurality of input symbols;

determining a plurality of variable (K) values for the plurality of input symbols, wherein the variable K values depend upon a plurality of elements in a plurality of disjoint sets that contain the plurality of input symbols;

generating interleaved addresses for the plurality of input symbols of a first frame;

generating interleaved addresses for a plurality of frame symbols following the first frame;

reading the plurality of first frame symbols from memory in an interleaved sequence; and writing the plurality of frame symbols following the first frame at the memory addresses from where the first frame symbols were read.

2. The method of claim 1, wherein the reading and writing operation are performed on a symbol by symbol basis and alternated until all symbols have been read.

3. The method of claim 1, wherein the plurality of frame symbol addresses are generated by an address generator.

4. A method for interleaving frame symbols in a digital communication system, comprising of:

generating a frame count ($f_c$) for a plurality of input symbols;

determining a plurality of variable (K) values for the plurality of input symbols, wherein the variable K values depend upon a plurality of elements in a plurality of disjoint sets that contain the plurality of input symbols;

generating interleaved addresses for the plurality of input symbols;

reading a symbol with the interleaved address; and writing a symbol at the address from where the symbol with the interleaved address is read.

5. The method of claim 4, alternating the reading and writing on a symbol by symbol basis until all input symbols have been read.

6. The method of claim 4, wherein a K-classifier and selector generates the variable K values, wherein the variable K values depend upon the number of elements in the plurality of disjoint sets.

7. The method of claim 4, further comprising:

determining an integer remainder (r) based upon a division of $f_c$ by K, wherein the value of r is determined by a $f_c$ mod K divider.

8. The method of claim 7, wherein an address transformation block performs plural transforms to generate the interleaved addresses, where the number of transforms are based upon the value of r.

9. An address generator for generating interleaved addresses for a plurality of input symbols in a digital communication system, comprising:

a K-classifier and selector that generates a plurality of variable values (K); wherein the variable K values depend upon a plurality of elements in a plurality of disjoint sets that contain the plurality of input symbols;

a Modulo-Kmax counter that generates a frame count value $f^c$ for the plurality of input symbols;

means for determining an integer remainder r, wherein the value of r depends upon the division of $f_c$ by K; and an address transformation module that performs a plurality of transforms based upon the value of r to generate a plurality of interleaved addresses for the plurality of input symbols.

10. The address generator of claim 9, wherein the integer remainder r is determined by a $f_c$ mod K divider.

11. A method for de-interleaving a plurality of frame symbols and generating addresses for the plurality of de-interleaved frame symbols in a digital communication system, comprising:

generating a frame count ($f_c$) for a plurality of input symbols;

determining a plurality of variable (K) values for the plurality of input symbols, wherein the variable K values depend upon a plurality of elements in a plurality of disjoint sets that contain the plurality of input symbols;

generating de-interleaved addresses for the plurality of input symbols of a first frame;

generating de-interleaved addresses for a plurality of frame symbols following the first frame;

reading the plurality of first frame symbols from memory in a de-interleaved sequence; and writing the plurality of frame symbols following the first frame at the memory addresses from where the first frame symbols were read.

12. The method of claim 11, wherein the reading and writing operation are performed on a symbol by symbol basis and alternated until all symbols have been read.

13. The method of claim 11, wherein the plurality of frame symbol addresses are generated by an address generator.

14. An address generator for generating de-interleaved addresses for a plurality of input symbols in a digital communication system, comprising:

a K-classifier and selector that generates a plurality of variable values (K); wherein the variable K values depend upon a plurality of elements in a plurality of disjoint sets that contain the plurality of input symbols;

a Modulo-Kmax counter that generates a frame count value $f^c$ for the plurality of input symbols;

means for determining an integer remainder r, wherein the value of r depends upon the division of $f_c$ by K; and an address transformation module that performs a plurality of inverse transforms based upon the value of r to generate a plurality of de-interleaved addresses for the plurality of input symbols.

15. The address generator of claim 14, wherein the integer remainder r is determined by a $f^c$ mod K divider.

16. A method for de-interleaving frame symbols in a digital communication system, comprising of:

generating a frame count ($f_c$) for a plurality of input symbols;

determining a plurality of variable (K) values for the plurality of input symbols, wherein the variable K values depend upon a plurality of elements in a plurality of disjoint sets that contain the plurality of input symbols;

generating de-interleaved addresses for the plurality of input symbols;

reading a symbol with the de-interleaved address; and writing a symbol at the address from where the symbol with the de-interleaved address is read.

17. The method of claim 16, alternating the reading and writing until all input symbols have been read on a symbol by symbol basis.

18. The method of claim 16, wherein a K-classifier and selector generates the variable K values, wherein the variable K values depend upon the number of elements in the plurality of disjoint sets.

19. The method of claim 16, further comprising:

determining an integer remainder (r) based upon a division of $f_c$ by K, wherein the value of r is determined by a $f_c$ mod K divider.

20. The method of claim 19, wherein an address transformation block performs plural transforms to generate the interleaved addresses, where the number of transforms are based upon the value of r.

21. A system used in a digital communication system using a single memory buffer for storing a plurality of input symbols, comprising:

an address generator for generating a frame count ($f_c$) for a plurality of input symbols, determining a plurality of variable (K) values for the plurality of input symbols, wherein the variable K values depend upon a plurality of elements in a plurality of disjoint sets that contain the plurality of input symbols, and generating an address for an input symbol wherein the input symbol is read out from the generated memory address and another symbol is written at the generated memory address.

22. The system of claim 21, wherein the read and write sequence is repeated until all the input symbols have been read out from the memory buffer.

* * * * *

UNITED STATES PATENT AND TRADEMARK OFFICE
CERTIFICATE OF CORRECTION

PATENT NO. : 6,553,517 B1  Page 1 of 1
DATED : April 22, 2003
INVENTOR(S) : Mohit K. Prasad It is certified that error appears in the above-identified patent and that said Letters Patent is hereby corrected as shown below:

Column 2,
Line 4, after "symbols," insert -- . --.

Column 4,
Line 9, after "divides", change "f$^c$/K" to -- f$_c$/K --.
Line 18, after "to", change "fc" to -- f$_c$ --.
Line 25, after "and", change "f$^c$" to -- f$_c$ --.
Line 40, after "to", change "f$^c$" to -- f$_c$ --.
Line 41, after "S403,", change "f$^c$" to -- f$_c$ --.

Column 6,
Line 56, after "b4", insert -- , --.

Column 9,
Line 26, after "303", change "partitionssymbols" to -- partitions symbols --.

Column 12,
Lines 17 and 63, after "value", change "f$^c$" to -- f$_c$ --.

Column 13,
Line 4, after "a", change "f$^c$" to -- f$_c$ --.

Signed and Sealed this

Seventeenth Day of February, 2004

JON W. DUDAS
*Acting Director of the United States Patent and Trademark Office*